(12) United States Patent
Mustafa et al.

(10) Patent No.: US 11,427,912 B2
(45) Date of Patent: Aug. 30, 2022

(54) HIGH TEMPERATURE ROTATION MODULE FOR A PROCESSING CHAMBER

(71) Applicant: APPLIED MATERIALS, INC., Santa Clara, CA (US)

(72) Inventors: Muhannad Mustafa, Santa Clara, CA (US); Muhammad M. Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 130 days.

(21) Appl. No.: 16/017,702

(22) Filed: Jun. 25, 2018

(65) Prior Publication Data

US 2019/0390337 A1 Dec. 26, 2019

(51) Int. Cl.
*C23C 16/458* (2006.01)
*C23C 16/455* (2006.01)
*H01L 21/687* (2006.01)

(52) U.S. Cl.
CPC ...... *C23C 16/4586* (2013.01); *C23C 16/4584* (2013.01); *C23C 16/45544* (2013.01); *H01L 21/68792* (2013.01)

(58) Field of Classification Search
CPC ............ C23C 16/4409; C23C 16/4584; C23C 16/4586; C23C 14/505; C23C 14/564; C23C 16/4408; C23C 16/4412; C23C 16/455; C23C 16/45557; C23C 16/45559; C23C 16/455563; C23C 16/4585; C23C 14/50; C23C 16/45563; C23C 16/458; C23C 16/4583; C23C 16/45544; H01L 21/68714; H01L 21/68792; H01L 21/68764; H01L 21/68785; H01J 37/32724; H01J 37/3244; H01J 37/32449; H01J 37/32513; H01J 37/32715
See application file for complete search history.

(56) References Cited

U.S. PATENT DOCUMENTS

| | | | |
|---|---|---|---|
| 5,356,476 A * | 10/1994 | Foster | C23C 16/14 118/715 |
| 5,800,686 A | 9/1998 | Littau et al. | |
| 6,120,605 A * | 9/2000 | Sato | C23C 16/4412 118/715 |
| 6,899,338 B2 | 5/2005 | Li et al. | |
| 6,932,871 B2 * | 8/2005 | Chang | C23C 16/45512 118/719 |

(Continued)

FOREIGN PATENT DOCUMENTS

WO WO-2016009781 A * 1/2016 ........... C23C 16/511

*Primary Examiner* — Benjamin Kendall
*Assistant Examiner* — Kurt Sweely
(74) *Attorney, Agent, or Firm* — Moser Taboada

(57) ABSTRACT

Embodiments of substrate processing equipment and rotatable substrate supports incorporating the same are provided herein. In some embodiments, the substrate support may include a pedestal having a substrate receiving surface, a shaft having an upper end, a lower end, and a central opening, where the shaft is coupled to the pedestal at the upper end, a hub circumscribing the shaft, where the shaft is rotatable with respect to the hub, and where the hub includes a first port that extends from an outer surface of the hub to a volume between the hub and the shaft, and a ferrofluid sealing assembly disposed between the hub and the shaft.

17 Claims, 6 Drawing Sheets

(56) References Cited

U.S. PATENT DOCUMENTS

| | | | | |
|---|---|---|---|---|
| 6,957,956 B2 * | 10/2005 | Toba | ............... | H01L 21/67109 |
| | | | | 118/730 |
| 8,329,575 B2 * | 12/2012 | Rajagopalan | ..... | H01L 21/02074 |
| | | | | 257/E21.584 |
| 8,506,713 B2 * | 8/2013 | Takagi | .............. | C23C 16/45574 |
| | | | | 118/715 |
| 2017/0096734 A1 | 4/2017 | Barriss et al. | | |
| 2017/0198395 A1 * | 7/2017 | Nozawa | ............ | H01J 37/32192 |

* cited by examiner

HIGH TEMPERATURE ROTATION MODULE FOR A PROCESSING CHAMBER

FIELD

Embodiments of the present disclosure generally relate to substrate processing equipment, and more specifically to rotating substrate supports used in such substrate processing equipment.

BACKGROUND

Integrated circuits comprise multiple layers of materials deposited by various techniques, including chemical vapor deposition (CVD) and atomic layer deposition (ALD). As such, the deposition of materials on a semiconductor substrate via CVD or ALD is a common technique used in the process of producing integrated circuits. For CVD or ALD, uniformity of metal deposition on a substrate is typically desired.

Typical CVD or ALD chambers may have a heated substrate support for heating a substrate during processing, a gas port for introducing process gases into the chamber, and a pumping port for maintaining the processing pressure within the chamber and to remove excess gases or processing by products. The inventors have observed that the flow pattern of the gases within the chamber from a slit valve side to a pumping port side can lead to non-uniformity of metal deposition.

As such, the inventors have provided an improved apparatus for uniformly depositing materials on a substrate.

SUMMARY

Embodiments of the disclosure provide improved apparatus for depositing layers on substrates, such as by chemical vapor deposition (CVD) or atomic layer deposition (ALD). In some embodiments, a rotatable substrate support includes a pedestal having a substrate receiving surface; a shaft having an upper end, a lower end, and a central opening, wherein the shaft is coupled to the pedestal at the upper end; a hub circumscribing the shaft, wherein the shaft is rotatable with respect to the hub, and wherein the hub includes a first port that extends from an outer surface of the hub to a volume between the hub and the shaft; and a ferrofluid sealing assembly disposed between the hub and the shaft.

In some embodiments, an apparatus for processing a substrate, includes: a chamber; and a substrate support assembly at least partially disposed in the chamber, the substrate support assembly comprising: a pedestal having a support surface; a rotating shaft having a central opening coupled to the pedestal; a hub that circumscribes the rotating shaft, wherein the rotating shaft is rotatable with respect to the hub; and a ferrofluid sealing assembly disposed between the hub and the rotating shaft to form at least one seal between the hub and the rotating shaft.

In some embodiments, a gas feedthrough for use in a rotatable substrate support includes: a shaft having a first port opening; a hub circumscribing the shaft, wherein the hub includes a first port; a first flow path that extends from the first port to the first port opening; and a ferrofluid sealing assembly disposed between the hub and the shaft, wherein the ferrofluid sealing assembly forms a first seal and a second seal, and wherein the first flow path is capable of passing from the hub to the shaft at a location disposed between the first and second seals.

These and other advantages are described in more detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate some embodiments of the disclosure and are therefore not to be considered limiting of scope, for the disclosure may admit to other equally effective embodiments.

FIG. 3b depicts a bottom view of the hub depicted in FIG. 3a.

Figure 1:
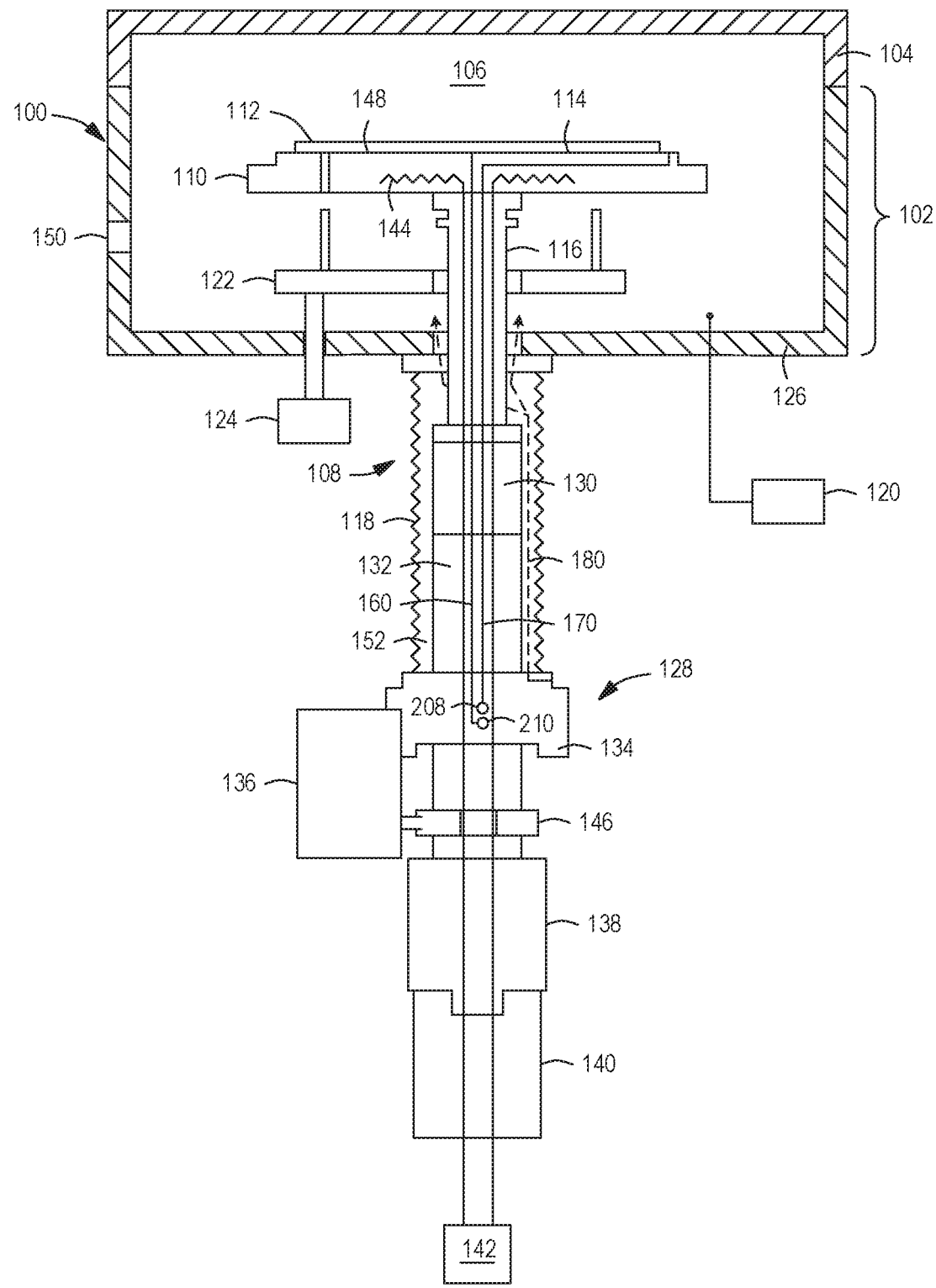
FIG. 1 depicts a schematic cross-sectional view of a substrate processing chamber in which a rotation module in accordance with some embodiments of the present disclosure may be utilized.

Where possible, identical reference numerals are used herein to designate elements that are common to the figures. The images used in the drawings may be simplified for illustrative purposes and are not necessarily depicted to scale. Elements and features of one embodiment may be beneficially incorporated in other embodiments without further recitation.

DETAILED DESCRIPTION

Embodiments of the disclosure provide an improved apparatus for depositing layers on substrates. Chemical vapor deposition (CVD) and atomic layer deposition (ALD) are deposition methods that may be beneficially performed using the improved apparatus. Examples of processing chambers that may be modified in accordance with the teachings provided herein include substrate processing chambers in the ENDURA® and CENTURA® line of substrate processing systems, all of which are commercially available from Applied Materials, Inc. of Santa Clara, Calif. The processing chamber and substrate support described herein may operate for example, at temperatures of about 50° Celsius to about 500° Celsius.

The apparatus disclosed herein includes a rotatable substrate support that may advantageously facilitate one or more of depositing films having reduced film thickness non-uniformity within a given process chamber and improved particle performance (e.g., reduced unwanted deposition). These and other advantages are described in more detail below.

FIG. 1 depicts a schematic cross-sectional view of a substrate processing chamber in which a rotation module in accordance with some embodiments of the present disclosure may be utilized. In some embodiments, the chamber 100 includes a chamber body 102 and a lid assembly 104. The chamber 100 has a processing volume 106 defined within the chamber body 102. A slit valve 150 in the chamber body 102 provides access for a robot (not shown) to deliver and retrieve a substrate 112, such as a 200, 300, 450 mm or the like semiconductor wafer, a glass substrate, or the like, to and from the chamber 100.

In some embodiments, the chamber 100 is coupled to and in fluid communication with an exhaust system 120 which includes a throttle valve (not shown) and vacuum pump (not shown) which are used to exhaust the chamber 100. The pressure inside the chamber 100 may be regulated by adjusting the throttle valve and/or vacuum pump.

A substrate support 108 that is rotatable comprises a pedestal 110 coupled to a support shaft 116 that is hollow. The pedestal 110 includes a substrate receiving surface 114 in the chamber 100 for receiving a substrate 112. The support shaft 116 extends down from the pedestal 110 and provides a conduit to provide, for example, purge gases, vacuum suction, fluids, coolants, power, or the like, to the pedestal 110. A lift plate 122, connected to a lift motor 124 is mounted in the chamber 100 to raise and lower lift pins movably disposed through the substrate support 108. The lift pins raise and lower the substrate 112 over the substrate receiving surface 114 of the pedestal 110. The pedestal 110 may include a vacuum chuck 148, an electrostatic chuck (not shown), or a clamp ring (not shown) to secure the substrate to the substrate support 108 during processing.

A temperature of the pedestal 110 may be adjusted to control the temperature of the substrate. For example, the pedestal 110 may be heated using a heating element (e.g., resistive heating element 144) that is embedded, such as a resistive heater, or may be heated using radiant heat, such as heating lamps configured to provide heat energy to the pedestal 110.

The substrate support 108 further comprises a rotation module 128. In some embodiments, the support shaft 116 is coupled to a rotating shaft 132 of a rotation module 128 via an adapter 130. The adapter 130 comprises a hollow cylindrical body. The adapter 130 provides a union for conduits of the support shaft 116 and for conduits of the rotation module 128. The rotation module 128 provides a conduit to provide, for example, purge gases, vacuum suction, fluids, coolants, power, or the like, to the pedestal 110. The rotation module 128 includes fixed components and components that are rotatable with respect to the fixed components. The rotation module 128 comprises a rotating shaft 132 circumscribed by a hub 134. The rotating shaft 132 can rotate with respect to the hub 134. A seal assembly (discussed below) is disposed between the rotating shaft 132 and the hub 134. A motor 136 is coupled to the rotating shaft 132 to rotate the pedestal 110 via the rotating shaft 132. The motor 136 can be mounted to the hub 134. In some embodiments, the motor 136 provide rotary movement to the rotating shaft 132 via a coupling assembly 146 comprising gears, pulleys, belts, or the like. In some embodiments, the rotating shaft 232 can be rotated up to 1000 rotations per minute.

In some embodiments, a bellows assembly 118 is disposed about the support shaft 116, the adapter 130, and the rotating shaft 132 and is coupled between the pedestal 110 and a bottom surface 126 of chamber 100 to provide a flexible seal that allows vertical motion of the pedestal 110 while preventing loss of vacuum from within the chamber 100. A volume between the bellows assembly 118 and the support shaft 116, the adapter 130, and the rotating shaft 132 defines a first volume 152.

In some embodiments the substrate support 108 further comprises a coolant feedthrough 138 (e.g., water feedthrough) that is coupled to the rotating shaft 132 on a side opposite the support shaft 116. The coolant feedthrough 138 may comprise a hollow cylindrical body. The coolant feedthrough 138 is configured to provide a conduit for fluids, power, gases or the like to the pedestal 110.

In some embodiments, the substrate support 108 further comprises a slip ring 140 that is coupled to the coolant feedthrough 138 on a side opposite the rotation module 128. The slip ring 140 may include fixed components and components rotatable with respect to the fixed components. The slip ring 140 is configured to couple power sources and other electrical devices to the pedestal 110 while allowing the substrate support 108 to rotate. For example, in some embodiments, as shown in FIG. 1, a power source 142 is coupled to heating elements 144 disposed in the pedestal 110 via leads that are capable of passing through the slip ring 140, the coolant feedthrough 138, the rotating shaft 132, the adapter 130, and the support shaft 116.

Figure 2:
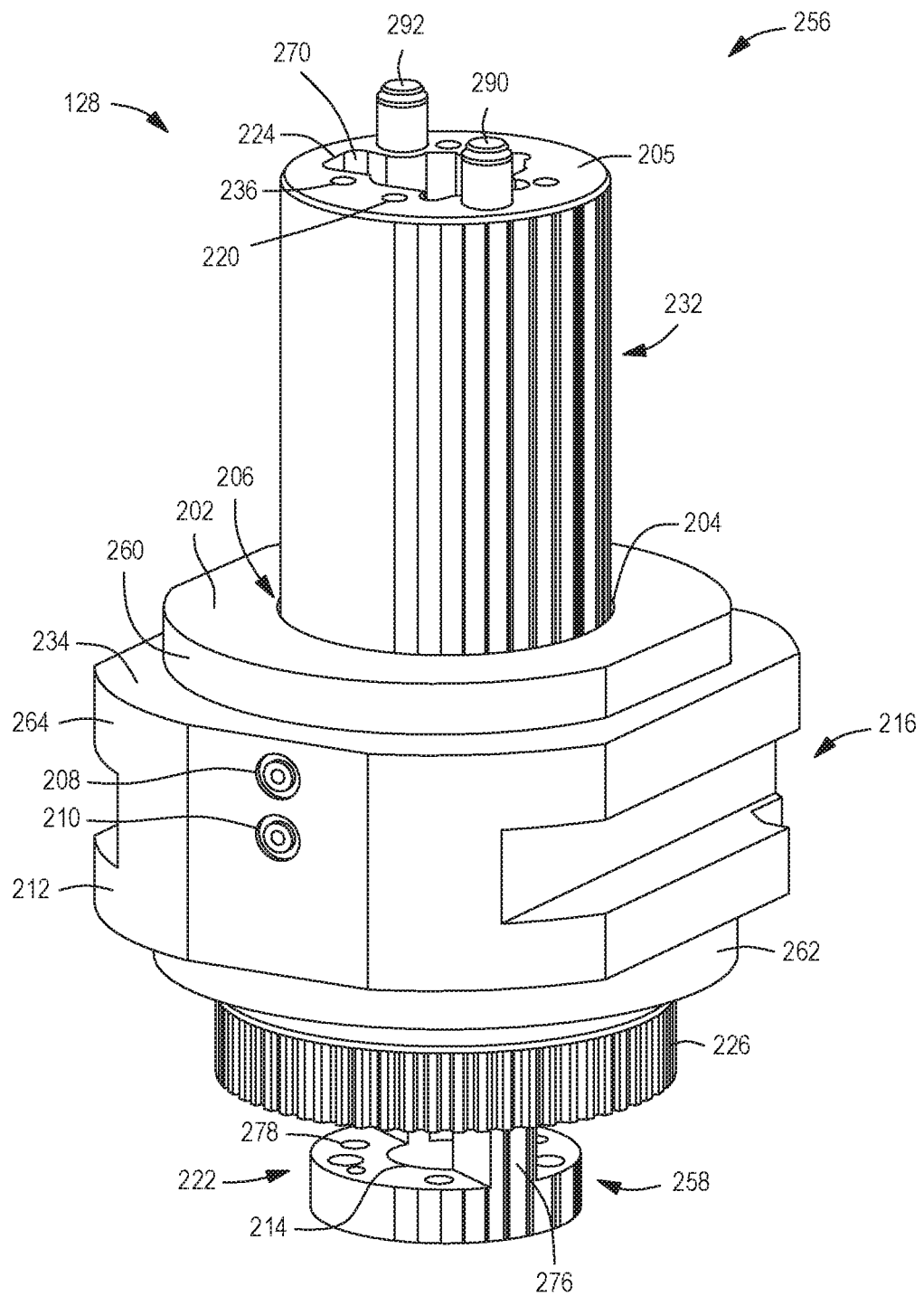
FIG. 2 depicts an isometric view of a rotation module in accordance with some embodiments of the present disclosure.

FIG. 2 depicts an isometric view of a rotation module 128 in accordance with some embodiments of the present disclosure. The rotation module 128 comprises a hub 234 that circumscribes a rotating shaft 232. The rotating shaft 232 can be anodized, nickel (Ni) plated, Yttria coated, or the like, to make the rotating shaft 232 capable of operating in a corrosive gaseous environment. In some embodiments, the rotating shaft 232 has a height of about 8.8 inches and an outer diameter of about 2.7 inches. In some embodiments, the hub 234 has a height of about 2.9 inches and an outer diameter of about 4.7 inches. The rotation module 128 further comprises a gear 226 disposed about the rotating shaft 232 and below the hub 234.

The hub 234 includes a top wall 202, a bottom wall 262, and a main body 264. The top wall 202, the bottom wall 262, and the main body 264 define a second volume 266. In some embodiments, an outer diameter of the top wall 202 is less than an outer diameter of the main body 264. The top wall 202 includes a central opening 204. A diameter of the central opening 204 is slightly greater than an outer diameter of the rotating shaft 232 such that a gap 206 may exist between the top wall 202 and the rotating shaft 232. The outer surfaces of the hub 234 may include features to accommodate a mounting bracket. In some embodiments, the hub 234 includes grooves 216 on opposite sides of the hub 234 extending inwardly from an outer surface 212 of the main body 264.

Figure 3A:
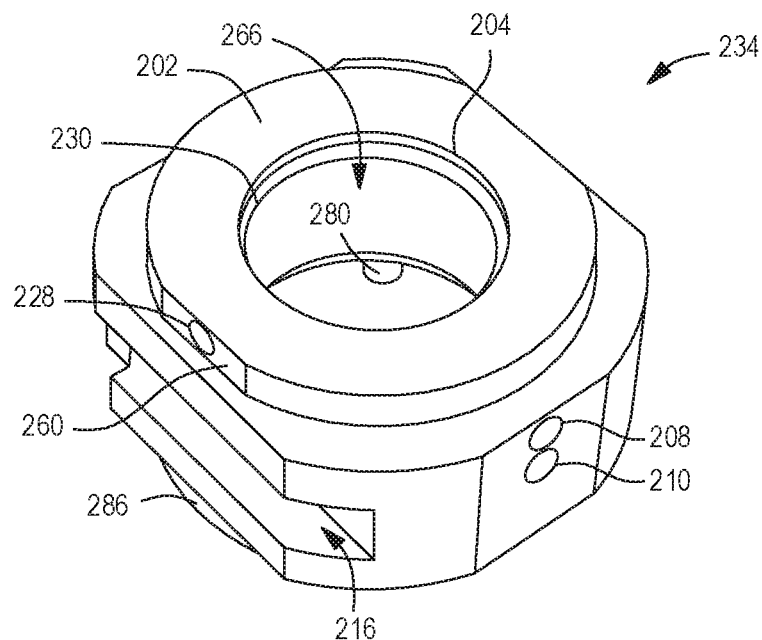
FIG. 3a depicts an isometric view of a hub of the rotation module depicted in FIG. 2.

FIG. 3a depicts an isometric view of a hub of the rotation module depicted in FIG. 2. The hub 234 includes a first port 208 extending from the outer surface 212 of the main body 264 to the second volume 266. In some embodiments, the hub 234 includes a second port 210 extending from the outer surface 212 of the main body 264 to the second volume 266. In some embodiments, as depicted in FIG. 3a, the first port 208 is arranged laterally above the second port 210. In some embodiments, the hub 234 includes a third port 228 extending from an outer surface 260 of the top wall 202 to the second volume 266. The third port 228 may be arranged at a ninety-degree angle from the first port 208 and the second port 210 with respect to a central axis of the hub 234. A ferrofluidic seal assembly 230 is disposed within the second volume 266. The ferrofluidic seal assembly 230 is configured to provide at least one seal between the hub 234 and the rotating shaft 232. The ferrofluidic seal assembly 230 advantageously improves in-chamber particle counts because the rotating shaft 232 does not come into contact with the seal surface.

Figure 3B:
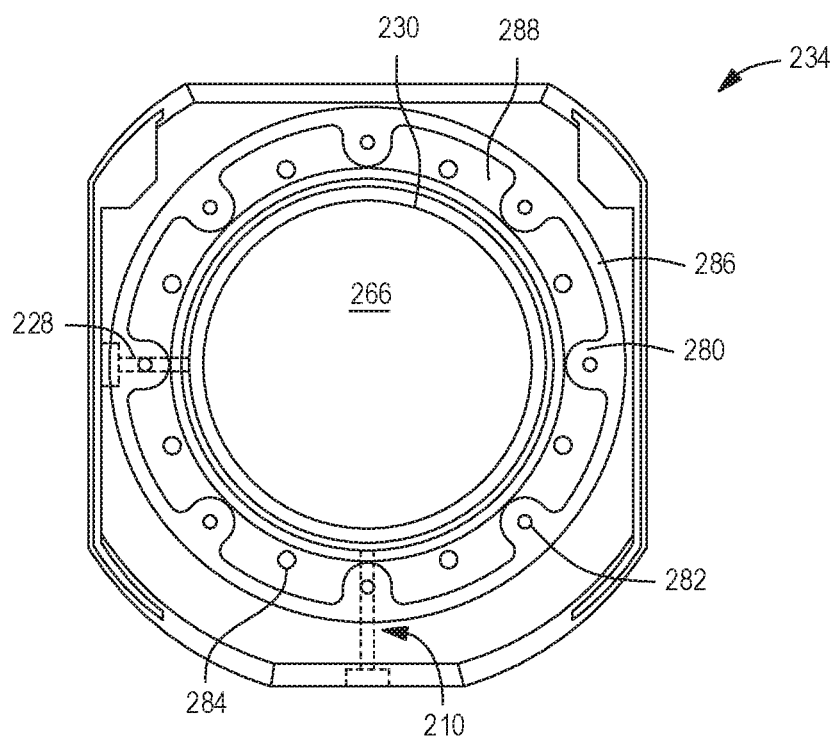

FIG. 3b depicts a bottom view of the hub 234 depicted in FIG. 3a. A bottom portion of the hub 234 includes a bottom surface 288. A plurality of holes 282 are disposed around a periphery of the bottom surface 288. A ring portion 286 extends from an outer peripheral edge of the bottom surface 288. The ring portion 286 includes a plurality of protrusions 280 extending from an inner sidewall of the ring portion 286 towards a central axis of the ring portion 286. Each protrusion of the plurality of protrusions 280 may include a hole 284. Holes 282 and holes 284 are capable of receiving a fastener, such as a screw, bolt, or the like.

Referring back to FIG. 2, the rotating shaft 232 includes a top end 256 and a bottom end 258. The rotating shaft 232 includes a top surface 205 at the top end 256. A central opening 224 extends from the top surface 205 towards the bottom end 258 to define sidewalls 270 of the rotating shaft 232. The central opening 224 provides a conduit for power cables, temperature sensor cables, or the like. In some embodiments, the rotating shaft 232 includes holes 236 extending down from the top surface 205. The holes 236 are configured to couple the rotation module 128 to another component of the substrate support 108 (e.g., the adapter 130 or the support shaft 116). The rotating shaft 232 includes a first gas line 218 extending from the top surface 205 towards the first port 208. The rotating shaft 232 includes a second gas line 220 extending from the top surface 205 towards the second port 210. A first alignment tab 290 protrudes from the top surface 205. A second alignment tab 292 protrudes from the top surface 205. In some embodiments, the first alignment tab 290 is diametrically opposed to the second alignment tab 292 about the top surface 205.

The rotating shaft 232 includes a ring portion 222 coupled to a pair of posts 276 that extend from the rotating shaft 232 at the bottom end 258. The ring portion 222 includes a central opening 214. In some embodiments, the ring portion 222 has an outer diameter of about 2.2 inches. The central opening 214 can cooperate with the central opening 224 to provide a conduit for power cables, temperature sensor cables, or the like. The ring portion 222 includes one or more fastener holes 278. The one or more fastener holes 278 are configured to couple the rotation module 128 to another component of the substrate support 108 (e.g., the coolant feedthrough 138). The ring portion 222 includes a supply port 272 extending from a bottom surface 196 of the ring portion 222 through one of the pair of posts 276. The ring portion 222 includes a return port 294 extending from the bottom surface 196 of the ring portion 222 through one of the pair of posts 276.

Figure 4:
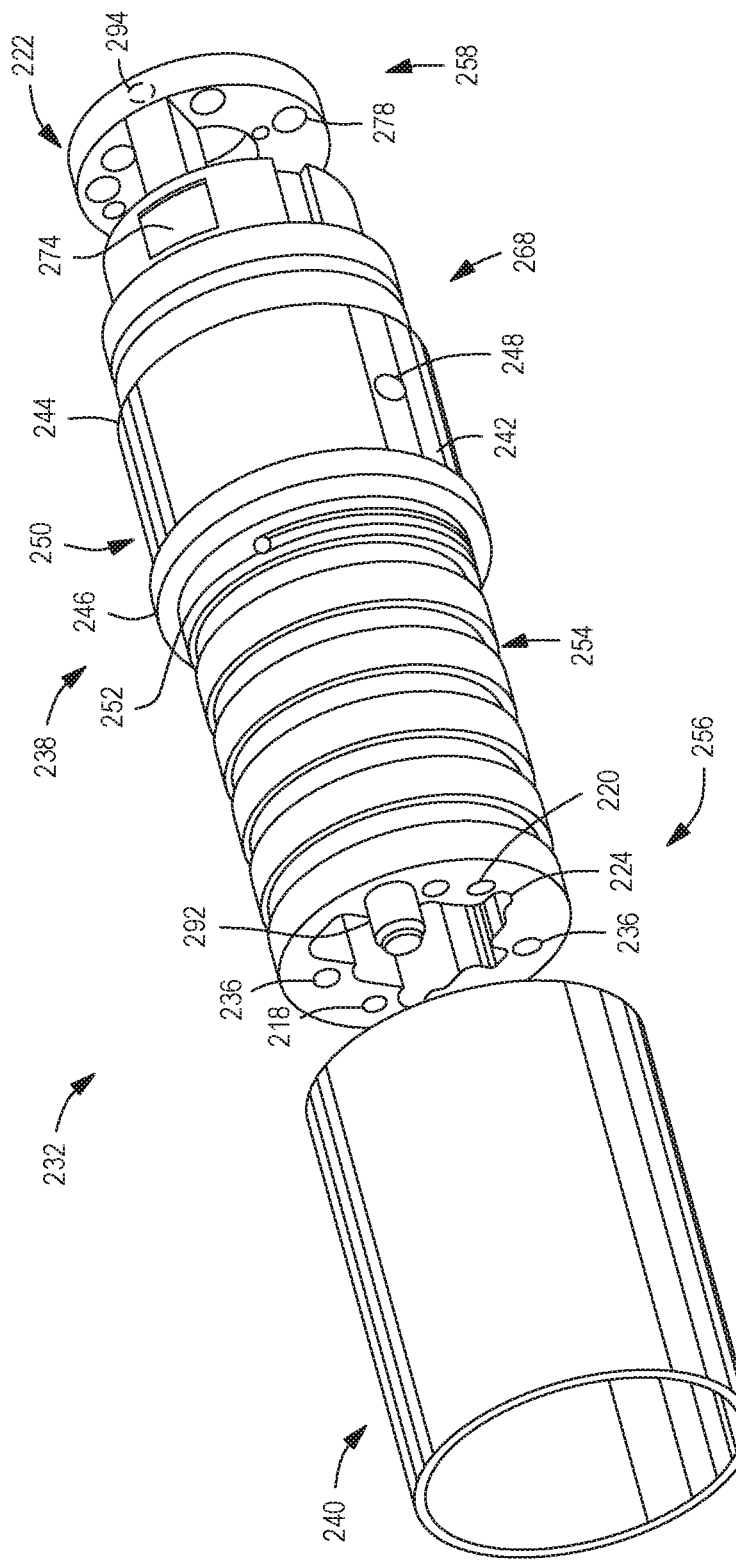
FIG. 4 depicts an exploded isometric view of a rotating shaft of the rotation module depicted in FIG. 2.

FIG. 4 depicts an exploded isometric view of a rotating shaft 232 of the rotation module 128 depicted in FIG. 2. The rotating shaft 232 includes a shaft body 238 and a sleeve 240. In some embodiments, the rotating shaft 232 and the sleeve 240 are made of metal, such as stainless steel. The shaft body 238 may include at least one coolant circulation channel to cool the rotating shaft 232. In some embodiments, as depicted in FIG. 4, the shaft body 238 includes a coolant circulation channel 254 having a spiral shape disposed on an outer surface 242 of the shaft body 238 near the top end 256. The coolant circulation channel 254 includes openings 252, one of which is fluidly connected to the supply port 272 and one of which is fluidly connected to the return port 294. The sleeve 240 circumscribes the shaft body 238 to cover the coolant circulation channel 254 and the openings 252. In some embodiments, the two ends of the sleeve 240 are welded to the shaft body 238. In use, coolant is capable of flowing from the coolant feedthrough 138 and through the supply port 272 to the coolant circulation channel 254 to cool the rotation module 128. The coolant is capable of flowing from the coolant circulation channel 254 back to the coolant feedthrough 138 via the return port 294.

The rotating shaft 232 includes a central portion 268 disposed between the coolant circulation channel 254 and the ring portion 222. The hub 234 is disposed about the central portion 268. The central portion 268 includes an outer surface 242. In some embodiments, the central portion 268 of the rotating shaft 232 includes a shoulder 244 near the ring portion 222. The shoulder 244 is capable of accommodating components for retaining the rotating shaft 232 (see description below). In some embodiments, the central portion 268 of the rotating shaft 232 includes an annular protrusion 246 adjacent the sleeve 240. The annular protrusion 246 is configured to act as a stop for the sleeve 240. A diameter of an outer surface of the annular protrusion 246 may be similar (e.g., substantially the same) to an outer diameter of the sleeve 240. In some embodiments, the rotating shaft 232 may include one or more notches 274 on the outer surface 242 between the shoulder 244 and the ring portion 222.

The central portion 268 includes a first port opening 248 that corresponds with a location of the first port 208. A first flow path extends through the first port 208 of the hub 234 and the first port opening 248 of the rotating shaft 232 to provide gas to an upper peripheral edge of the pedestal via the first gas line 218 of the rotating shaft 232 (i.e. edge purge). In some embodiments, the central portion 268 includes a second port opening 250 (See FIG. 6) on a side opposite the first port opening 248 that corresponds with a location of the second port 210. A second flow path extends through the second port 210 of the hub 234 and the second port opening 250 of the rotating shaft 232 to provide vacuum suction to a vacuum chuck disposed in the pedestal 110 via the second gas line 220 of the rotating shaft 232 (i.e. vacuum chucking). A third flow path extends through the third port 228 of the hub 234 to a bottom surface of the pedestal 110 via the first volume 152, the gap 206, and the second volume 266 (i.e. bottom purge).

Figure 5:
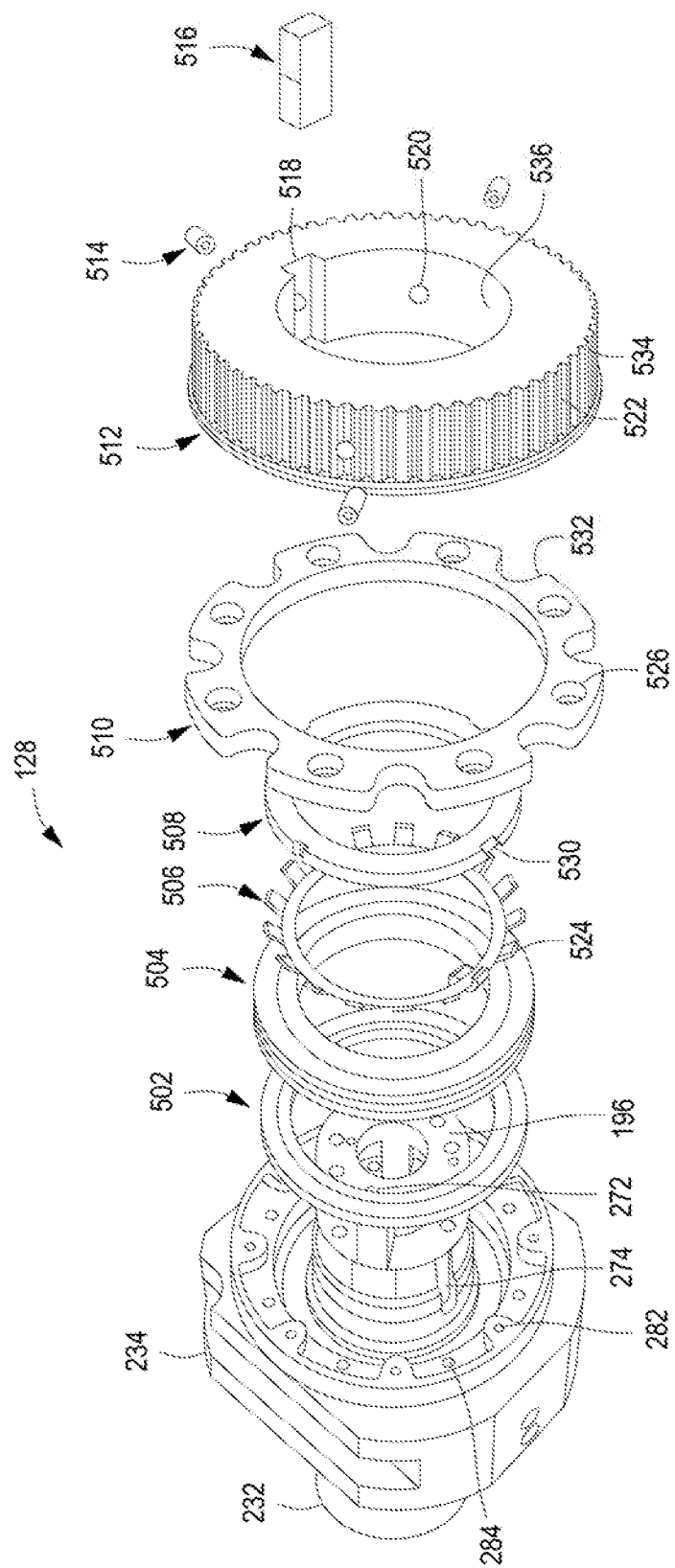
FIG. 5 depicts an exploded isometric view of a rotation module in accordance with some embodiments of the present disclosure.

FIG. 5 depicts an exploded isometric view of a rotation module in accordance with some embodiments of the present disclosure. The rotation module 128 includes a hub 234 circumscribing a rotating shaft 232. A ferrofluid seal assembly 230 is disposed between the hub 234 and the rotating shaft 232. A spacer 502 is disposed about the rotating shaft 232 and within the hub 234. A bearing 504 is disposed about the rotating shaft 232 and within the hub 234. The spacer 502 separates the ferrofluid seal assembly from the bearing 504. The bearing 504 may be disposed adjacent the shoulder 244 of the rotating shaft 232. In some embodiments, the bearing 504 is a cross-roller bearing configured to accept loads from all directions (i.e. axial and radial loads). The bearing 504 is capable of facilitating the rotary motion between the hub 234 and the rotating shaft 232.

A retaining ring 506 is disposed adjacent the bearing 504 on a side opposite the spacer 502. The retaining ring 506 includes one or more tabs 524 extending from the retaining ring 506. A bearing nut 508 is disposed below the retaining ring 506. The bearing nut 508 includes one or more slots 530 corresponding with the one or more tabs 524 of the retaining ring 506. The one or more tabs 524 are capable of being bent into each slot 530 to constrain a relative rotation between the bearing nut 508, the retaining ring 506. In some embodiments, at least one of the one or more tabs 524 is capable of being bent into the notch 274 of the rotating shaft 232 to constrain relative rotation between the retaining ring 506 and the rotating shaft 232.

An annular cover 510 is disposed at least partially within the hub 234 adjacent the bearing nut 508. The annular cover 510 includes a plurality of indents 532 extending from an outer sidewall of the annular cover 510 towards a central axis of the annular cover 510. The plurality of indents 532 are sized to correspond with the plurality of protrusions 280 of the hub 234. The annular cover 510 includes a plurality of holes 526. Each hole of the plurality of holes 526 of the annular cover 510 can be concentric with each hole of the plurality of holes 284 of the hub 234. A plurality of fasteners are capable of passing through the plurality of holes 526 and the plurality of holes 284 to fasten the annular cover 510 to the hub 234. The annular cover 510 is capable of constraining an axial motion of the bearing 504 with respect to the rotating shaft 232.

A gear 512 is disposed about the rotating shaft 232 between the annular cover 510 and the ring portion 222 of the rotating shaft 232. An outer sidewall of the gear 512 includes features 522, such as teeth, grooves, or the like. The features 522 are configured to accommodate the coupling assembly 146 (e.g., belts, gears, pulleys). The gear 512 may include one or more through holes 520 extending from an outer sidewall 534 to an inner sidewall 536. For example, the one or more through holes 520 can include three holes. The gear 512 may include a slot 518 extending from the inner sidewall 536 towards the outer sidewall 534. One or more set screws 514 are capable of coupling the gear 512 to the rotating shaft 232 via the through holes 520. In some embodiments, the one or more notches 274 of the rotating shaft 232 correspond with the locations of the one or more set screws 514 to advantageously reduce or prevent at least relative axial motion between the gear 512 and the rotating shaft 232. In some embodiments, a block 516 is at least partially disposed in the slot 518 of the gear 512 and one of the notches 274 of the rotating shaft 232 to advantageously reduce or prevent at least relative rotational motion between the gear 512 and the rotating shaft 232. In some embodiments, one of the one or more through holes 520 extends into the slot 518. One of the one or more set screws 514 is capable of retaining the block 516 into one of the notches 274 to reduce or prevent axial motion of the block 516 with respect to the gear 512.

In some embodiments, the spacer 502, the annular cover 510, and a portion of the bearing 504 are configured to be fixed rotationally with respect to the hub 234. In some embodiments, the rotating shaft 232, the gear 512, the bearing nut 508, the retaining ring 506, and a portion of the bearing 504 are configured to rotate with respect to the hub 234.

Figure 6:
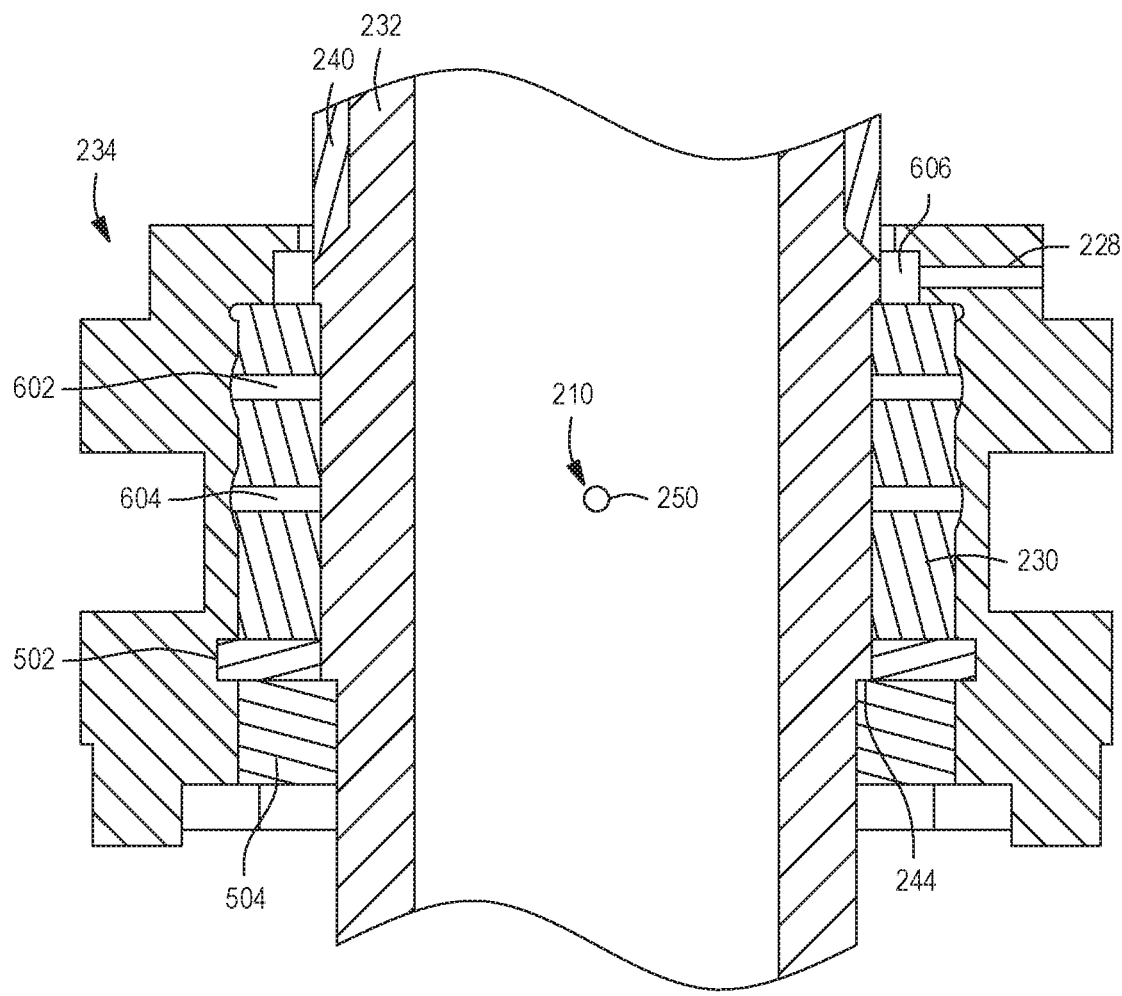
FIG. 6 depicts a simplified partial cross sectional view of the rotation module depicted in FIG. 2.

FIG. 6 depicts a simplified partial cross sectional view of the rotation module depicted in FIG. 2. A ferrofluid seal assembly 230 is disposed between a rotating shaft 232 and a hub 234. In some embodiments, as depicted in FIG. 6, the ferrofluid seal assembly 230 includes a first seal and a second seal to define a first annular channel 602 corresponding with a location of a first port 208 of the hub 234 and a first port opening 248 of the rotating shaft 232. The ferrofluid seal assembly 230 includes a third seal. The second seal and the third seal define a second annular channel 604 corresponding with a location of a second port 210 of the hub 234 and a second port opening 250 of the rotating shaft 232. In some embodiments, the hub 234 includes a third port 228. The hub 234, the rotating shaft 232, and the ferrofluid seal assembly 230 define a third volume 606. The third volume 606 is in fluid connection with the third port 228.

In some embodiments, a first gas flow 170 path extends from the first port 208 to a peripheral edge of the pedestal 110 via the first annular channel 602 and the first port opening 248. In use, a purge gas, such as Argon, is capable of flowing through the first gas flow path to perform an edge purge while the pedestal 110 is rotating. An edge purge advantageously prevents or reduces unwanted deposition on a substrate. An edge purge also advantageously promotes uniform deposition of metal at the edges of a substrate.

In some embodiments, a second gas flow 160 path extends from the second port 210 to a vacuum chuck 148 (e.g. for use with CVD process) of the pedestal 110 via the second annular channel 604 and the second port opening 250. In use, a suction force applied at the second port 210 is capable of chucking the substrate while the pedestal 110 is rotating.

In some embodiments, a third gas flow path 180 extends from the third port 228 to an underside of the the pedestal 110 via the third volume 606 and the first volume 152. In use, a purge gas, such as Argon, is capable of flowing through the third gas flow path to perform a bottom purge while the pedestal 110 is rotating. A bottom purge advantageously prevents or reduces unwanted deposition on a substrate backside and chamber bottom.

The first gas flow path, the second gas flow path, and the third gas flow path can be advantageously implemented at the same time through the hub 234 and the rotating shaft 232 while maintaining the ultra-vacuum environment of the chamber 100.

Thus, an improved apparatus for depositing films on a substrate has been disclosed herein. The apparatus may be used with a rotatable substrate support to advantageously facilitate one or more of depositing films having reduced film thickness non-uniformity within a given process chamber and improved particle performance (e.g., reduced unwanted deposition).

While the foregoing is directed to embodiments of the present disclosure, other and further embodiments of the disclosure may be devised without departing from the basic scope thereof.

The invention claimed is:
1. A substrate support, comprising:
a pedestal having a substrate receiving surface;
a support shaft coupled to the pedestal;
a rotation module coupled to the support shaft, the rotation module comprising:
a rotating shaft having an upper end, a lower end, a central opening, and a first gas line extending axially and radially outward of the central opening to the upper end of the rotating shaft, wherein the upper end of the rotating shaft is coupled to a lower end of the support shaft;
a hub circumscribing the rotating shaft, wherein the rotating shaft is rotatable with respect to the hub, and wherein the hub includes a first port that extends from an outer surface of the hub to a volume between the hub and the rotating shaft and that is fluidly coupled to the first gas line, wherein an entirety of the hub surrounds the rotating shaft between the upper end of the rotating shaft and the lower end of the rotating shaft;
a ferrofluid sealing assembly disposed between the hub and the rotating shaft;
a first flow path to provide a gas to an upper peripheral edge of the pedestal through the rotating shaft, wherein the first flow path extends through the first port of the hub and through a first port opening of the rotating shaft that extends into the rotating shaft from a radially outer sidewall of the rotating shaft to the first gas line; and
wherein the ferrofluid sealing assembly forms a first and a second seal between the hub and the rotating shaft, and wherein the first flow path circumscribes the rotat- ing shaft and extends through a first annular channel defined b the first seal and the second seal.

2. The substrate support of claim 1, further comprising a second flow path to provide a vacuum at a substrate receiving surface, wherein the second flow path extends through a second port of the hub and a second port opening of the rotating shaft.

3. The substrate support of claim 1, further comprising a bellows assembly disposed about the rotating shaft between the hub and the pedestal, and a third flow path to provide gas to an underside of the pedestal, wherein the third flow path extends through a third port of the hub, a gap between the hub and the rotating shaft, and between the bellows assembly and the rotating shaft.

4. The substrate support of claim 1, wherein the rotating shaft comprises at least one coolant circulation channel having a continuous spiral shape and disposed on an outer surface of the rotating shaft between the upper end of the rotating shaft and the hub.

5. The substrate support of claim 4, further comprising a coolant feedthrough coupled to the lower end of the rotating shaft, wherein coolant disposed within the coolant feedthrough is capable of passing through one or more openings of the rotating shaft and into the at least one coolant circulation channel.

6. The substrate support of claim 4, wherein the rotating shaft includes a main body and a sleeve, and the at least one coolant circulation channel is disposed between the main body and the sleeve.

7. The substrate support of claim 1, further comprising:
a gear disposed about the rotating shaft and below the hub; and
a motor coupled to the rotating shaft between the hub and the lower end of the rotating shaft to provide rotary movement to the substrate support via the gear.

8. An apparatus for processing a substrate, comprising:
a chamber having a chamber body to define a processing volume therein; and
a substrate support assembly at least partially disposed in the processing volume, the substrate support assembly comprising:
a pedestal having a support surface;
a support shaft coupled to the pedestal;
a rotating shaft disposed entirely outside of the chamber body and having an upper end coupled to a lower end of the support shaft outside the chamber body, the rotating shaft having a central opening;
a hub spaced from a bottom surface of the chamber body that circumscribes the rotating shaft, wherein the rotating shaft is disposed through a central opening of the hub and is rotatable with respect to the hub, and wherein the hub includes a first port that extends from an outer surface of the hub to a volume between the hub and the rotating shaft, and wherein there is a gap between the upper end of the rotating shaft and a central opening of the hub configured to provide a gas flow path; and
a ferrofluid sealing assembly disposed between the hub and the rotating shaft to form at least one seal between the hub and the rotating shaft;
a first flow path to provide a gas to an upper peripheral edge of the pedestal through the rotating shaft, wherein the first flow path extends through the first port of the hub and through a first port opening of the rotating shaft that extends into the rotating shaft from a radially outer sidewall of the rotating shaft to a first gas line; and
wherein the ferrofluid sealing assembly forms a first and a second seal between the hub and the rotative shaft, and wherein the first flow path circumscribes the rotating shaft and extends through a first annular channel defined by the first seal and the second seal.

9. The apparatus of claim 8, further comprising a first flow path to provide a gas to an upper peripheral edge of the pedestal through the rotating shaft, wherein the first flow path extends through the first port of the hub and through a first port opening of the rotating shaft that extends into the rotating shaft from a radially outer sidewall of the rotating shaft.

10. The apparatus of claim 8, wherein the rotating shaft is disposed through a central opening of the hub and the gap is defined by sidewalls of the central opening of the hub and the rotating shaft.

11. The apparatus of claim 8, wherein the substrate support assembly further comprises a heater disposed within the pedestal.

12. The apparatus of claim 11, wherein the substrate support assembly further comprises a slip ring coupled to the rotating shaft outside of the hub, the slip ring capable of electrically coupling a power source to the heater, wherein the first port is disposed between the slip ring and the processing volume.

13. A gas feedthrough for use in a rotatable substrate support, comprising:
a shaft having a central opening, a first port opening on a radially outer sidewall of the shaft;
a hub circumscribing the shaft, wherein the hub includes a first port corresponding with a location of the first port opening;
a first flow path that extends from the first port to the first port opening;
a ferrofluid sealing assembly disposed between the hub and the shaft, wherein the ferrofluid sealing assembly forms a first seal and a second seal, and wherein the first flow path circumscribes the shaft and extends through a first annular channel defined by the first seal and the second seal, and
a second flow path that extends from a second port of the hub through a second port opening formed in a sidewall of the shaft, wherein the ferrofluid sealing assembly forms a third ferrofluidic seal, and wherein the second flow path extends through a second annular channel defined b the second seal and the third ferrofluidic seal and to a top surface of the shaft radially outward of the central opening.

14. The gas feedthrough of claim 13, further comprising a bearing disposed about the shaft and within the hub, and a spacer disposed between the bearing and the ferrofluid sealing assembly.

15. The gas feedthrough of claim 14, further comprising an annular cover coupled to the hub, wherein the annular cover is capable of constraining an axial motion of the bearing.

16. The gas feedthrough of claim 13, wherein the shaft includes at least one coolant circulation channel having a continuous spiral shape and disposed on an outer surface of the shaft.

17. The gas feedthrough of claim 13, wherein the first port is arranged vertically above the second port.

* * * * *